(12) United States Patent
Ho et al.

(10) Patent No.: US 8,597,976 B2
(45) Date of Patent: Dec. 3, 2013

(54) MULTILEVEL-CELL MEMORY STRUCTURES EMPLOYING MULTI-MEMORY LAYERS WITH TUNGSTEN OXIDES AND MANUFACTURING METHOD

(75) Inventors: ChiaHua Ho, Kaohsiung (TW); Erh-Kun Lai, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 137 days.

(21) Appl. No.: 12/683,007

(22) Filed: Jan. 6, 2010

(65) Prior Publication Data

US 2010/0105165 A1 Apr. 29, 2010

Related U.S. Application Data

(62) Division of application No. 11/625,216, filed on Jan. 19, 2007, now Pat. No. 7,667,220.

(51) Int. Cl.
*H01L 21/00* (2006.01)
*H01L 21/16* (2006.01)

(52) U.S. Cl.
USPC ........... 438/104; 438/95; 257/4; 257/E21.459

(58) Field of Classification Search
USPC ............ 438/95, 381, 104; 257/4, 5, E21.459, 257/E45.002
See application file for complete search history.

(56) References Cited

U.S. PATENT DOCUMENTS

| | | | |
|---|---|---|---|
| 4,499,557 A | 2/1985 | Holmberg et al. | |
| 4,876,220 A | 10/1989 | Mohsen et al. | |
| 4,881,114 A | 11/1989 | Mohsen et al. | |
| 5,831,325 A | 11/1998 | Zhang | |
| 5,835,396 A | 11/1998 | Zhang | |
| 6,034,882 A | 3/2000 | Johnson et al. | |
| 6,420,215 B1 | 7/2002 | Knall et al. | |
| 6,420,725 B1 | 7/2002 | Harshfield | |
| 6,483,736 B2 | 11/2002 | Johnson et al. | |
| 6,979,837 B2 * | 12/2005 | Tripsas et al. | 257/40 |
| 7,129,133 B1 * | 10/2006 | Avanzino et al. | 438/244 |
| 7,232,765 B1 | 6/2007 | Avanzino et al. | |
| 7,288,782 B1 * | 10/2007 | Avanzino et al. | 257/4 |
| 2003/0026121 A1 * | 2/2003 | Johnson et al. | 365/130 |
| 2003/0234449 A1 | 12/2003 | Aratani et al. | |

(Continued)

OTHER PUBLICATIONS

Johnson, Mark, et al., "512-Mb PROM With a Three-Dimensional Array of Diode/Antifuse Memory Cells," IEEE J. of Solid-State Circuits, vol. 38, No. 11, Nov. 2003, 1920-1928.

*Primary Examiner* — Chuong A Luu
*Assistant Examiner* — Nga Doan
(74) *Attorney, Agent, or Firm* — Haynes Beffel & Wolfeld LLP

(57) ABSTRACT

The present invention provides multilevel-cell memory structures with multiple memory layer structures where each memory layer structure includes a tungsten oxide region that defines different read current levels for a plurality of logic states. Each memory layer structure can provide two bits of information, which constitutes four logic states, by the use of the tungsten oxide region that provides multilevel-cell function in which the four logic states equate to four different read current levels. A memory structure with two memory layer structures would provide four bits of storage sites and 16 logic states. In one embodiment, each of the first and second memory layer structures includes a tungsten oxide region extending into a principle surface of a tungsten plug member where the outer surface of the tungsten plug is surrounded by a barrier member.

12 Claims, 9 Drawing Sheets

(56) References Cited

U.S. PATENT DOCUMENTS

2006/0098472 A1 5/2006 Ahn et al.
2006/0215445 A1* 9/2006 Baek et al. .................... 365/158
2006/0228883 A1 10/2006 Happ
2007/0132049 A1 6/2007 Stipe
2007/0153570 A1 7/2007 Suh
2007/0158690 A1* 7/2007 Ho et al. ....................... 257/209

* cited by examiner

MULTILEVEL-CELL MEMORY STRUCTURES EMPLOYING MULTI-MEMORY LAYERS WITH TUNGSTEN OXIDES AND MANUFACTURING METHOD

CROSS REFERENCE TO RELATED APPLICATIONS

This application is a divisional of copending U.S. patent application Ser. No. 11/625,216 filed on 19 Jan. 2007 (now U.S. Pat. No. 7,667,220), and such application is incorporated by reference as if fully set forth herein.

BACKGROUND OF THE INVENTION

1. Field of the Invention

The present invention relates to high density memory devices based on programmable resistance memory materials, including metal-oxide based materials and other materials, and to methods for manufacturing such devices.

2. Description of Related Art

In the manufacturing of high density memory, the amount of data per unit area on an integrated circuit can be a critical factor. Thus, technologies for stacking multiple planar arrays of memory devices have been proposed. See for example, Johnson et al., "512-Mb PROM With a Three-Dimensional Array of Diode/Anti-fuse Memory Cells" IEEE J. of Solid-State Circuits, vol. 38, no. 11, November 2003. In the design described in Johnson et al., multiple layers of word lines and bit lines are provided, with memory elements at the crosspoints. The memory elements comprise a p+ polysilicon anode connected to a word line, and an n− polysilicon cathode connected to a bit line, with the anode and cathode separated by anti-fuse material. Issues that stacked planar arrays need to address include cost and simplicity of manufacturing.

It is desirable to provide high density stacked memory technologies that are readily manufactured and reliable.

SUMMARY OF THE INVENTION

The present invention provides multilevel-cell (MLC) memory structures with multiple memory layer structures where each memory layer structure includes a tungsten oxide region that defines different read current levels for a plurality of logic states. Each memory layer structure can provide two bits of information, which constitutes four logic states, by the use of the tungsten oxide region that provides multilevel-cell function in which the four logic states equate to four different read current levels. A memory structure with two memory layer structures would provide four bits of storage sites and 16 logic states.

In a first embodiment, a multilevel-cell memory structure includes a first memory layer structure and a second memory layer structure. Each of the memory layer structures is physically and electrically connected to a bit line on top. The first or lower memory layer structure is connected to an n-p diode where the n-p diode is connected to a first bit line. The second or upper memory layer is connected to a p-n diode on the bottom where the p-n diode is connected to a second bit line. The second bit line is shared between the first memory layer structure and the second memory layer structure. The second bit line is further connected to the first memory layer structure. Each of the first and second memory layer structures includes a tungsten oxide region extending into a principle surface of a tungsten plug member where the outer surface of the tungsten plug is surrounded by a barrier member.

The critical dimension of the tungsten oxide region is less than the size of the tungsten plug member. The critical dimension of the tungsten oxide region is also less than the size of the p-n diode. The relationship between the critical dimension of the tungsten oxide region, the critical dimension of the tungsten plug member, and the thickness of the p-n diode can be represented mathematically as follows: $dA \approx dW - 2*tD$, where the parameter dA represents the critical dimension of the tungsten plug, the parameter dW represents the critical dimension of the plug structure member, and the parameter tD represents the critical dimension of the p-n diode. The critical dimension of the p-n diode is larger than the critical dimension of the tungsten oxide region, represented mathematically as $dD > dA$.

In a second embodiment, a multilevel-cell memory structure comprises a first memory layer structure and a second memory layer structure. Each of the first and second memory layer structures includes a tungsten oxide region extending from a principle surface of a tungsten plug member where the outer surface of the tungsten plug member is surrounded by a barrier member. Each of the tungsten plug structures has a dimension that is sufficiently small so that a dielectric step during the manufacturing process can be skipped. The critical dimension for each tungsten plug structure is about the same size as the critical dimension for an active area (the tungsten oxide region).

In a third embodiment, a multilevel-cell memory structure comprises a first memory layer structure and a second memory layer structure. The first memory layer structure includes the tungsten oxide region, a tungsten plug structure having a first plug portion and a second plug portion, and the outer wall of the second plug is surrounded by a barrier member. The critical dimension of the first plug portion is similar to the critical dimension of the active area, i.e. tungsten oxide region. The tungsten oxide portion extends from a principle surface or a top surface of the first plug portion. The first plug portion has a dimensional value which is less than the second plug portion. The first plug portion and the second plug portion in each memory layer structure can be manufactured using a self-align process or an non-self-align process.

A method for manufacturing a memory device is also described that comprises a plug structure with a plug material surrounded by a barrier material and disposed between dielectric members. The top portion of the plug material and the barrier material are etched with a dry etch using a first chemistry followed by a wet recess etch with a second chemistry. Dielectric spacers are formed over a principle surface of the etched plug material. A tungsten oxide region is formed that enters the principle surface of the etched plug material by a dry oxygen plasma strip. A bit line is formed into the dielectric spacers and over the tungsten oxide region.

Broadly stated, a memory structure having multiple memory layers comprises a first memory layer structure having a first electrode with a principle surface and a tungsten oxide region, the tungsten oxide region extending from the principle surface of the first electrode and electrically connecting between the first electrode and a second electrode, the first electrode having a dimension that is substantially similar to a dimension of the tungsten oxide region; and a second memory layer structure, coupled to the first memory layer structure, having a first electrode with a principle surface and a tungsten oxide region, the tungsten oxide region extending from the principle surface of the first electrode in the second memory layer structure and electrically connecting between the first electrode in the second memory layer structure and a second electrode in the second memory layer structure, the first electrode in the second memory layer structure having a dimension that is substantially similar to a dimension of the tungsten oxide region in the second memory layer structure.

The structures and methods of the present invention are disclosed in the detailed description below. This summary does not purport to define the invention. The invention is defined by the claims. These and other embodiments, features, aspects, and advantages of the technology can be understood with regard to the following description, appended claims and accompanying drawings.

BRIEF DESCRIPTION OF THE DRAWINGS

The invention will be described with respect to specific embodiments thereof, and reference will be made to the drawings, in which.

DETAILED DESCRIPTION

Figure 1:
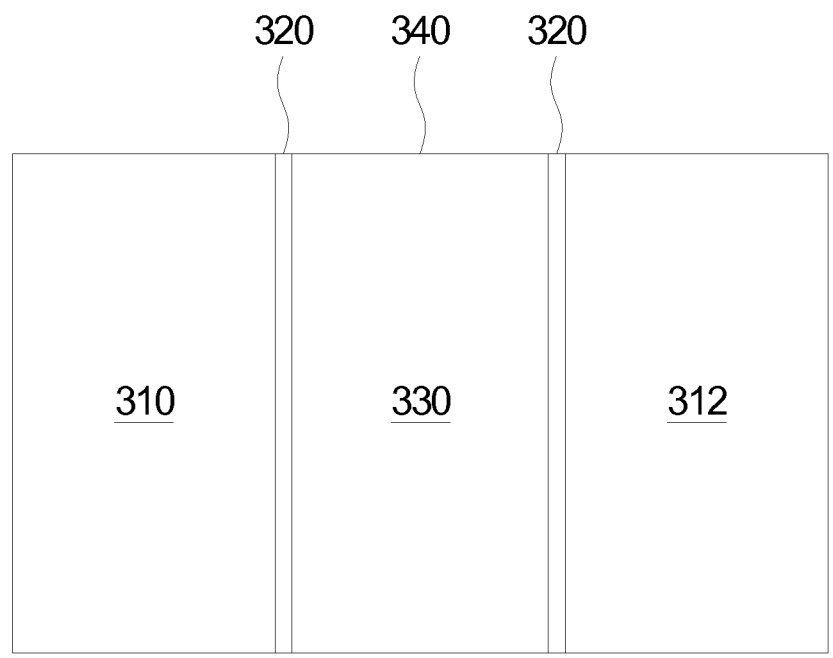
FIG. 1 is a simplified process diagram illustrating a reference step in the manufacturing of the bistable resistance random access memory with a standard tungsten plug or via process in a single memory cell in accordance with the present invention.

A description of structural embodiments and methods of the present invention is provided with reference to FIGS. 1-9. It is to be understood that there is no intention to limit the invention to the specifically disclosed embodiments but that the invention may be practiced using other features, elements, methods and embodiments. Like elements in various embodiments are commonly referred to with like reference numerals.

Various embodiments are directed at three-dimensional memory structures and a manufacturing method for memory, such as nonvolatile embedded memory implementing programmable resistance RAM. Examples of resistance device RAM are resistance memory (RRAM), polymer memory, and phase change memory (PCRAM).

FIG. 1 is a simplified process diagram 300 illustrating a reference step in the manufacturing of the resistance random access memory with a standard tungsten plug (W-plug) or a via process in a single memory cell. A via or contact hole is formed with dielectric members 310, 312 and barrier material 320. A tungsten material 330 is filled into the via disposed between the barrier material 320. A polishing technique such as chemical-mechanical polishing (CMP) or etch back is performed on a surface 340 after the deposition of the tungsten material 330. In one embodiment, the critical dimension (CD) of a tungsten plug (W-plug) 330 complies with the following design rules: for 0.13 μm technology node, the via or contact of W-plug CD ranges from 0.1 μm to 0.25 μm.

Figure 2:
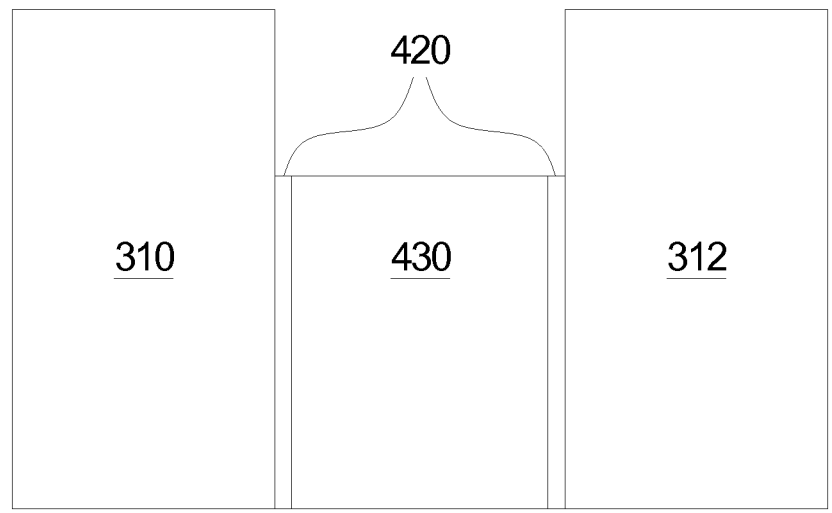
FIG. 2 is a process diagram showing a next step in the manufacturing of the bistable resistance random access memory with a recess etch of a tungsten plug structure in accordance with the present invention.

FIG. 2 is a process diagram 400 showing a next step in the manufacturing of the resistance random access memory that carries out a recess etch of a tungsten plug member 430. The recess etch process of the tungsten plug member 430 may be carried out by $SF_6$ dry etch, or other chemistries including Ar and/or $N_2$ and/or $O_2$. The aspect ratio of the recess etch is about 1, e.g., the critical dimension of 200 nm has the depth of about 200 nm. After the tungsten recess etch, a barrier isotropic etch process etches away a portion of the Ti or TiN from the barrier 320 to form a barrier member 420. A suitable etching technique for the barrier isotropic etch is by dry etch with chemistries of chlorine ($Cl_2$) and/or trichloroborane ($BCl_3$) and/or others, such as Argon (Ar). A wet clean with a solvent, such as EKC265 or others, can be used to remove the polymer residue during the barrier etch.

Figure 3:
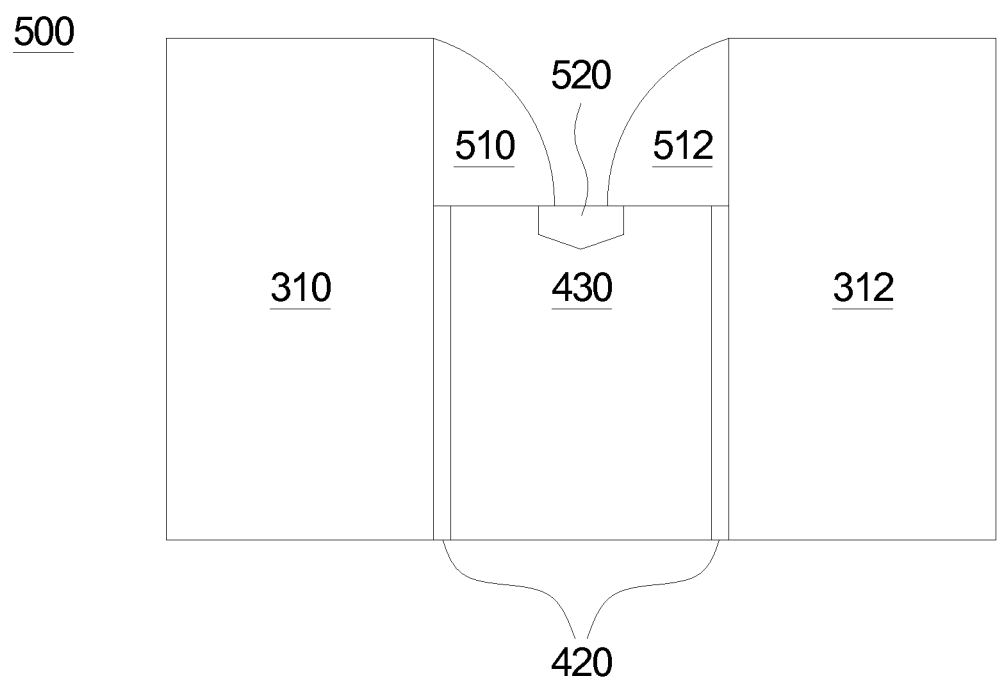
FIG. 3 is a process diagram illustrating the formation of a tungsten oxide region with a dielectric spacer etch, a dry dioxide plasma etch and a wet strip in accordance with the present invention.

FIG. 3 is a process diagram 500 illustrating the formation of a tungsten oxide ($WO_X$) with a dielectric spacer etch, a dry dioxide plasma etch and a wet strip. In the dielectric spacer etch, the process involves depositing a dielectric film and etching dielectric spacers 510, 512. The dielectric film is deposited over the tungsten plug member 430 with a chemical vapor deposition (CVD) technique. Suitable materials for implementing the dielectric film include silicon dioxide $SiO_2$, silicon nitride SiN or silicon oxynitride SiON. The dielectric film possesses the characteristic of a conformal property. A typical thickness of the dielectric film ranges from about 50 nm to about 100 nm. The dielectric film is deposited over the tungsten plug member 430, which is then etched to form dielectric spacers 510, 512. Using a dry etch by chemistries of $CF_4$ and/or $C_4F_8$, in which the etching stops on the top surface of the tungsten plug member 430 with a slight tungsten recess to ensure that there is sufficient over-etching, is suitable dielectric spacer etch.

After the dielectric spacer etch, a $WO_X$ member 520 is formed with an oxygen ($O_2$) plasma dry strip. Embodiments of the oxygen plasma dry strip process include a pure $O_2$ gas plasma chemistry, or mixed chemistries for $O_2$ plasma such as $O_2/N_2$ or $O_2/N_2/H_2$. Suitable mix chemistries for $O_2$ plasma include $O_2/N_2$, $O_2/N_2/H_2$, or pure $O_2$ gas with a plasma, such as direct plasma, magnetic field enhance reactive ion plasma, or down-stream plasma. Exemplary parameters of a down-stream plasma include a pressure of about 1500 mtorr, a power of about 1000 W, an $O_2/N_2$ flow of about 3000 sccm/200 sccm, a temperature of about 150° C., and a time duration of about 400 seconds.

A wet strip is carried out to remove polymer residue that is generated during dielectric spacer etch process. A suitable chemical for the wet strip is aqueous organic mixtures such as solvent of EKC265 or other types of the same or similar mixtures. The wet strip step may be optional if the dry $O_2$ plasma is sufficiently over-stripped.

Figure 4:
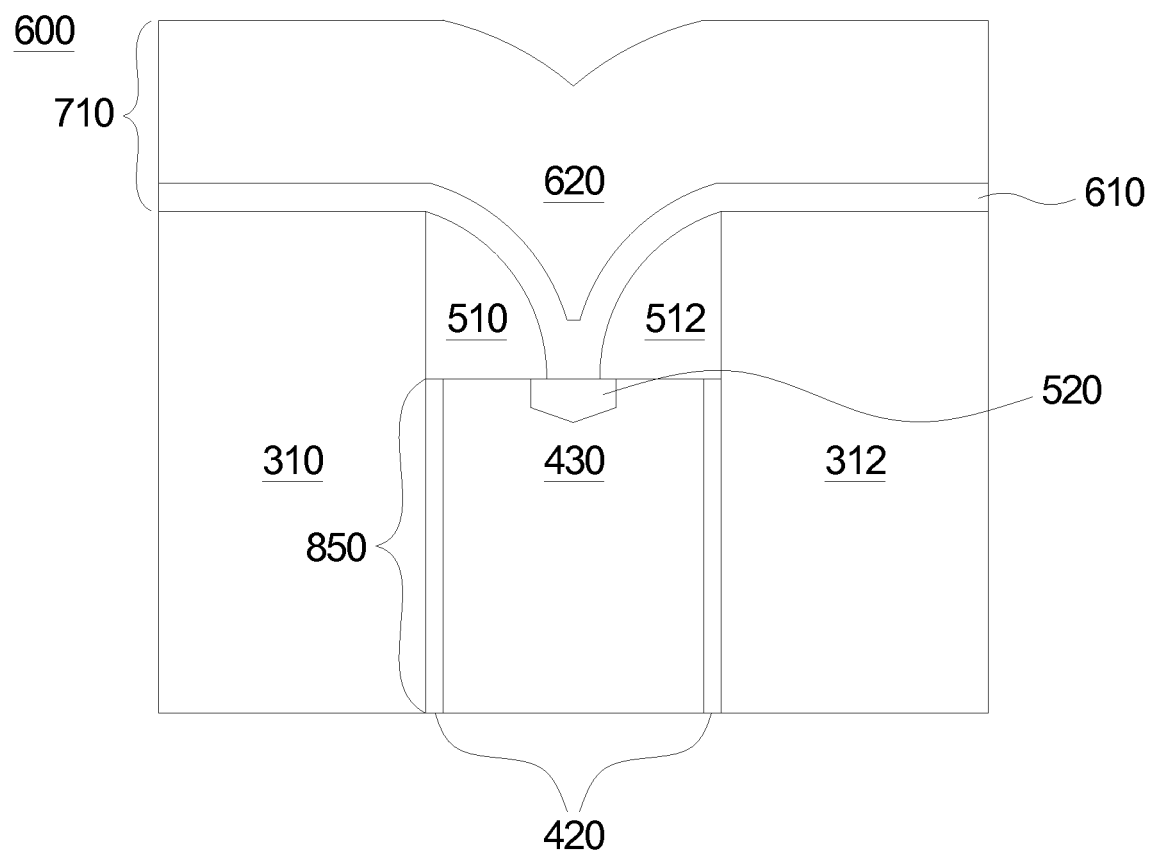
FIG. 4 is a process diagram showing a next step in the manufacturing of the bistable resistance random access memory with the formation of a bit line in accordance with the present invention.

FIG. 4 is a process diagram 600 showing a next step in the manufacturing of the resistance random access memory with the formation of a bit line. An optional step is depositing a barrier layer 610 over the dielectric members 310, 312 and the dielectric spacers 510, 512 by using chemical vapor deposition process. Titanium nitride (TiN) or tantalum nitride (TaN) can be selected, for example, as a suitable material for implementing the barrier layer 610. The deposition of the barrier layer 610 may be an optional step if there is sufficient adhesion when a bit line layer 620 is deposited.

The bit line layer 620 is deposited over the barrier layer 610 assuming that the optional step of the barrier layer deposition is executed. If the deposition of the barrier layer 610 is skipped, the bit line layer 620 is deposited directly over the dielectric members 310, 312 and the dielectric spacers 510, 512. Suitable materials for implementing the bit line layer 620 include poly-Si, W, Cu, or AlCu. If poly-Si is selected for implementing the bit line layer 620, a heavy doping may be required to decrease the amount of resistance.

Figure 5:
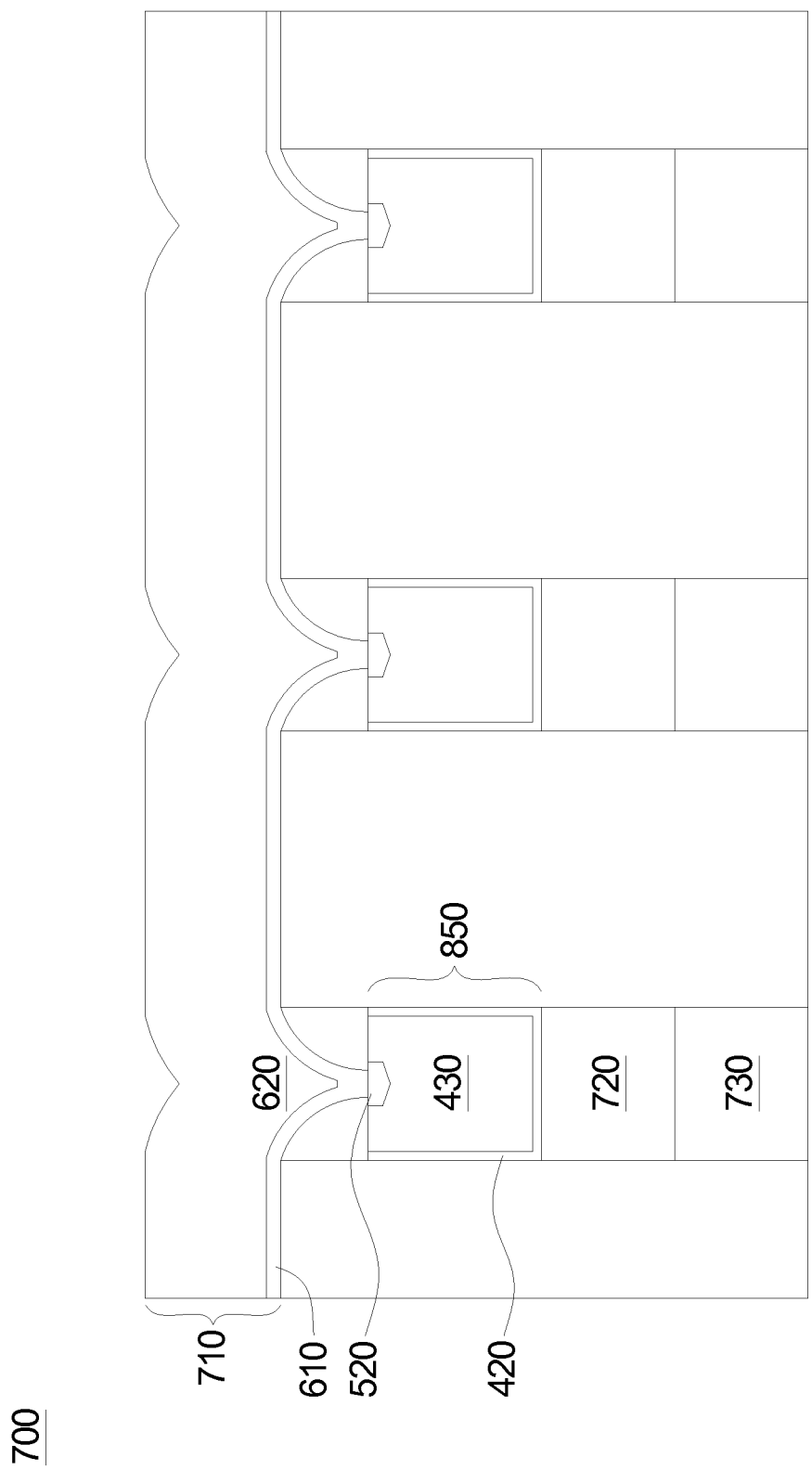
FIG. 5 is a process diagram showing a next step in the manufacturing of the bistable resistance random access memory with connections to select devices in accordance with the present invention.

Process diagram 600 represents a simplified memory cell with a memory layer structure 850 and a top bit line 710, which includes either just the bit line layer 620 or a combination of the bit line layer 620 and the barrier layer 610, with the dielectric spacers 510, 512, and dielectric members 310, 312. FIG. 5 is a process diagram 700 showing a next step in the manufacturing of the resistance random access memory with connections to select devices. The memory layer structure 850 is coupled to a p-n diode 720, which is in turn coupled to a bottom bit line 730. Suitable materials for implementing the bottom bit line layer 730 include poly-Si, W, Cu, or AlCu.

Figure 6:
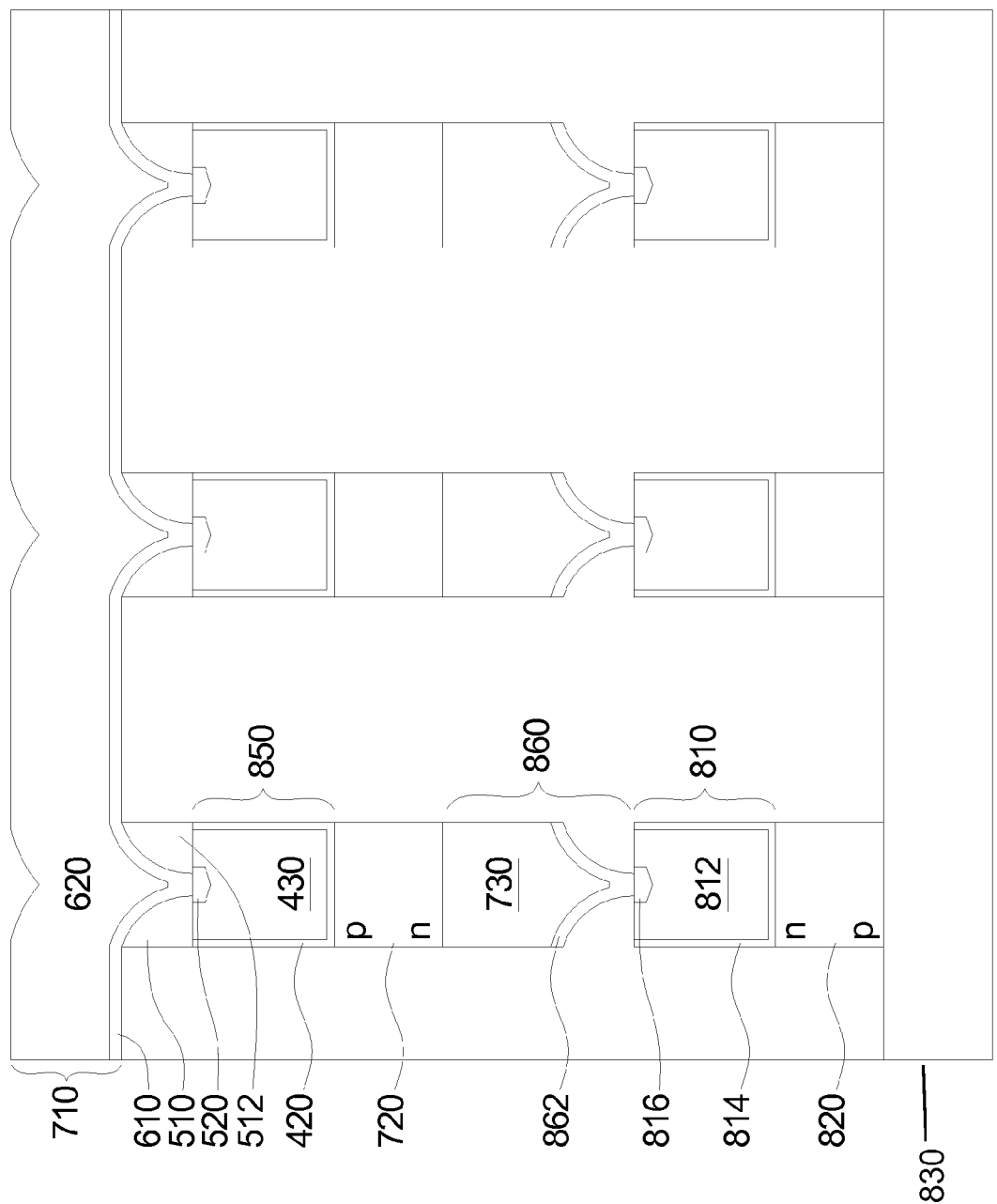
FIG. 6 is a process diagram illustrating a first embodiment of a memory structure with multi-memory layers and a tungsten oxide region for multilevel-cell functions in accordance with the present invention.

FIG. 6 is a process diagram illustrating a first embodiment of a memory structure 800 with multi-memory layers and a tungsten oxide region for multilevel-cell functions. In this embodiment, the memory structure 800 includes two memory layers, a first memory layer 810 and a second memory layer 850. The first memory layer 810 is coupled to an n-p diode 820, which is in turn coupled to a bottom bit line 830. The first memory layer structure 810 comprises a tungsten oxide region 816, a tungsten plug member 812 and a barrier member 814. The tungsten oxide region 816 extends into a principle surface of the tungsten plug member 812 or a first electrode 812. The barrier member 814 surrounds the tungsten plug member 812.

The tungsten oxide region 816 in the first memory layer structure 810 electrically contacts a second bit line 860 or a second electrode associated with the first memory layer structure 810. The second bit line 860 includes just the bit line 730, or a combination of the bit line 730 and the barrier layer 862. The second bit line 860 in this embodiment serves a dual purpose, first as a top bit line associated with the first memory layer structure 810 and second as a bottom bit line associated with the second memory layer structure 850.

The second bit line 860 is electrically coupled to the p-n diode 720 on top, which is in turn electrically coupled to the second memory layer structure 850. The second memory layer structure 850 comprises the tungsten oxide region 520, the tungsten plug member 430 and the barrier member 420. The tungsten oxide region 520 extends into a principle surface of the tungsten plug member or a first electrode 430. The barrier member 420 surrounds the tungsten plug member 430.

The tungsten oxide region 520 in the second memory layer structure 850 electrically contacts the top bit line or a third bit line 710, or a second electrode associated with second memory layer structure 710. The third bit line 710 includes just the bit line 620, or a combination of the bit line 620 and the barrier layer 610.

The critical dimension of an active area (i.e., the tungsten oxide region 520) is determined by the size of the tungsten plug member 430 and the thickness of the dielectric spacers 510, 512. In this embodiment, the critical dimension of the tungsten oxide region 520 is less than the size of the tungsten plug member 430. The critical dimension of the tungsten oxide region 520 is also less than the size of the p-n diode 720. The relationship between the critical dimension of the tungsten oxide region 520, the critical dimension of the tungsten plug member 430, and the thickness of the p-n diode 720 can be represented mathematically as follows:

$$d_A \approx d_W - 2 \cdot t_D$$

where the parameter $d_A$ represents the critical dimension of the tungsten oxide element 520, the parameter $d_W$ represents the critical dimension of the plug structure member 430, and the parameter $t_D$ represents the thickness of the dielectric spacers 510, 512. The critical dimension of the p-n diode 720 is larger than the critical dimension of the tungsten oxide region 520, represented mathematically as $d_D > d_A$. In one embodiment, for example, the critical dimension of the p-n diode 720 is about ten times the critical dimension of the tungsten oxide region 520, represented mathematically as $d_D > 10 \cdot d_A$. Other exemplary critical dimensions for the parameters describe above are, but are not limited to, the critical dimension of the p-n diode $d_D = 0.3$ μm, the critical dimension of the tungsten plug member $d_W = 0.3$ μm, the critical dimension of the thickness of the dielectric spacer $t_D = 135$ mm, and the critical dimension of the tungsten oxide region $d_A = 30$ nm.

Figure 7:
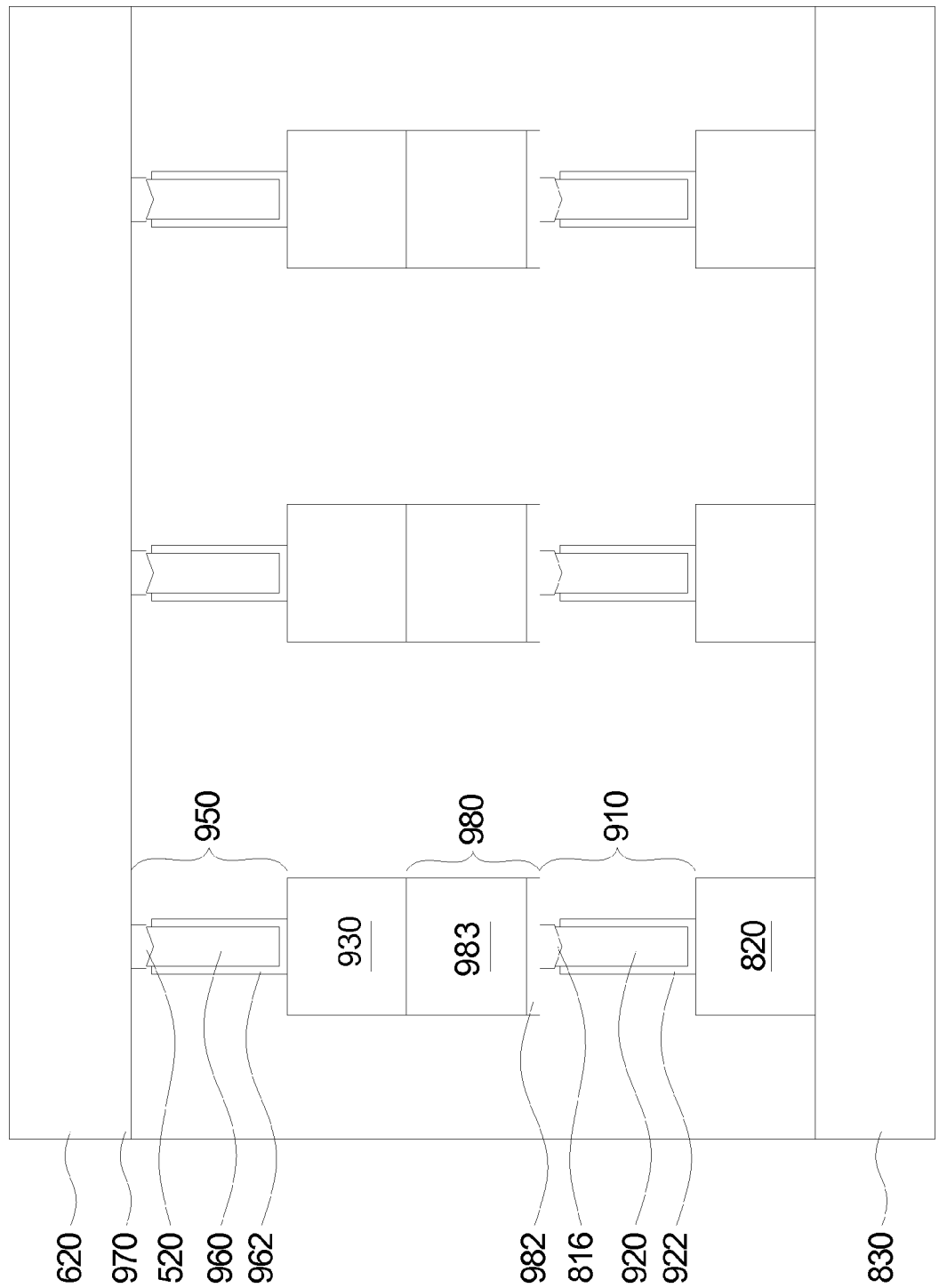
FIG. 7 is a process diagram illustrating a second embodiment of a memory structure with multi-memory layers and a tungsten oxide region for multilevel-cell functions in accordance with the present invention.

FIG. 7 is a process diagram illustrating a second embodiment of a memory structure 900 with multi-memory layers and a tungsten oxide region for multilevel-cell functions. The memory structure 900 comprises a first memory layer structure 910 and a second memory layer structure 950. The first memory layer structure 910 includes the tungsten oxide region 816 extending from a principal surface of a tungsten plug structure 920 surrounded by a barrier member 922. The second memory layer structure 950 includes the tungsten oxide region 520 overlying on a principal surface of a tungsten plug structure 960 surrounded by a barrier member 962. Each of the tungsten plug structures 920, 960 has a dimension that is sufficiently small so that the dielectric step as described with respect to FIG. 3 can be skipped during the manufacturing of the memory structure 900. The critical dimension of the size of the tungsten plug structure 920, 960 is about the same size as the critical dimension for the respective active area, i.e. the tungsten oxide region 816 and the tungsten oxide region 520. A second bit line 980, disposed above the tungsten oxide region 816 and below the p-n diode 930, has a barrier member 982 with a dimension that is similar to a dimension of the bit line member 983. A third bit line 620, disposed on the tungsten oxide region 520 has a barrier member 970.

Figure 8:
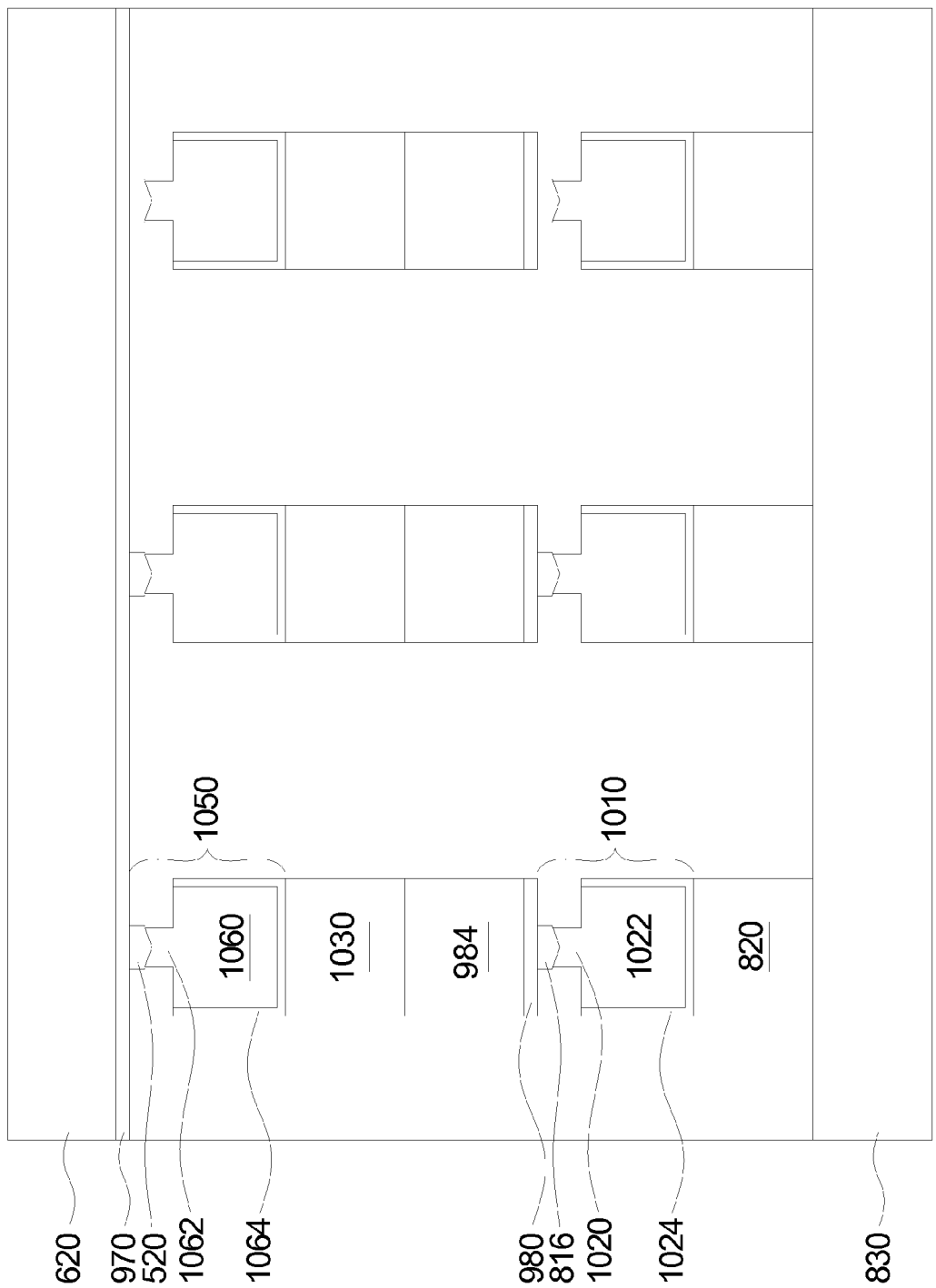
FIG. 8 is a process diagram illustrating a third embodiment of a memory structure with multi-memory layers and a tungsten oxide region for multilevel-cell functions in accordance with the present invention.

FIG. 8 is a process diagram illustrating a third embodiment of a memory structure 1000 with multi-memory layers and a tungsten oxide region for multilevel-cell functions. The memory structure 1000 comprises a first memory layer structure 1010 and a second memory structure 1050. The first memory layer structure 1010 includes the tungsten oxide region 816, a tungsten plug structure having a first plug portion 1020 and a second plug portion 1022, and the outer walls of the second plug are surrounded by a barrier member 1024. The second memory layer structure 1050 includes the tungsten oxide region 520, a tungsten plug structure having a first plug portion 1062 and a second plug portion 1060, and the outer walls of the second plug are surrounded by a barrier member 1064. The critical dimensions of the first plug portion 1020 on the first layer structure 1010 and of the first plug portion 1062 on the second layer structure 1050 are similar to the critical dimensions of the active areas, i.e. tungsten oxide region 816 and tungsten oxide region 520. In the first memory layer structure 1010, the tungsten oxide portion 816 extends from a principle surface or a top surface of the first plug portion 1020. The first plug portion 1020 has a dimensional value which is less than the second plug portion 1022. Likewise in the second layer structure 1050, the tungsten oxide portion 520 extends from a principle surface or a top surface of the first plug portion 1062. The first plug portion 1060 has a dimensional value which is less than the second plug portion 1060. First bit line 830 is under the first diode 820. Second bit line 984 with barrier layer 980 provides a second electrode contacting the tungsten oxide region 816 in the first memory layer structure. Diode 1030 lies between the bit line 984 and the second memory layer structure 1050. Third bit line 620 with barrier layer 970 provides a second electrode contacting the tungsten oxide region 520 in the second memory layer structure.

The first plug portion 1020 and the second plug portion 1022 can be manufactured using a self-align process or a non-self-align process. For the non-self-align process, two photolithographic processes are typically employed to define the tungsten plug structure with two different critical dimensions, a first critical dimension for the first plug portion 1020 and a second critical dimension for the second plug portion 1022.

The self-align process involves a step to reduce a cross-section of a part of the interlayer contacts. This reduction process is performed in some embodiments by forming dielectric structures at least partly covering the interlayer contacts, and reducing a cross-section of a part of the interlayer contacts by removing material from a part of the interlayer contacts uncovered by the dielectric structures. One example of reducing the cross-section is performed as follows. A dielectric layer is exposed by the interlayer contacts, by removing another dielectric layer at least by the interlayer contacts. A new dielectric layer is formed at least partly covering the interlayer contacts. Only part of the new dielectric layer covering the interlayer contacts is removed, thereby leaving dielectric structures at least partly covering the interlayer contacts. One example of removing the new material is by wet etching part of the new dielectric layer for a duration, which controls a critical dimension of the interlayer contacts achieved by reducing the cross-section. A chemical mechanical polishing (CMP) process planarizes the surface and opens the contact portions which are covered by the formation of dielectric structures. $O_2$ plasma oxidation is used to form the tungsten oxide region 520 and the tungsten oxide region 816. For additional information on the self-align process and the chemical mechanical process, see U.S. patent application Ser. No. 11/426,213 entitled "Programmable Resistive RAM and Manufacturing Method", filed on 23 Jun. 2006, owned by the assignee of this application and incorporated by reference as if fully set forth herein.

Figure 9:
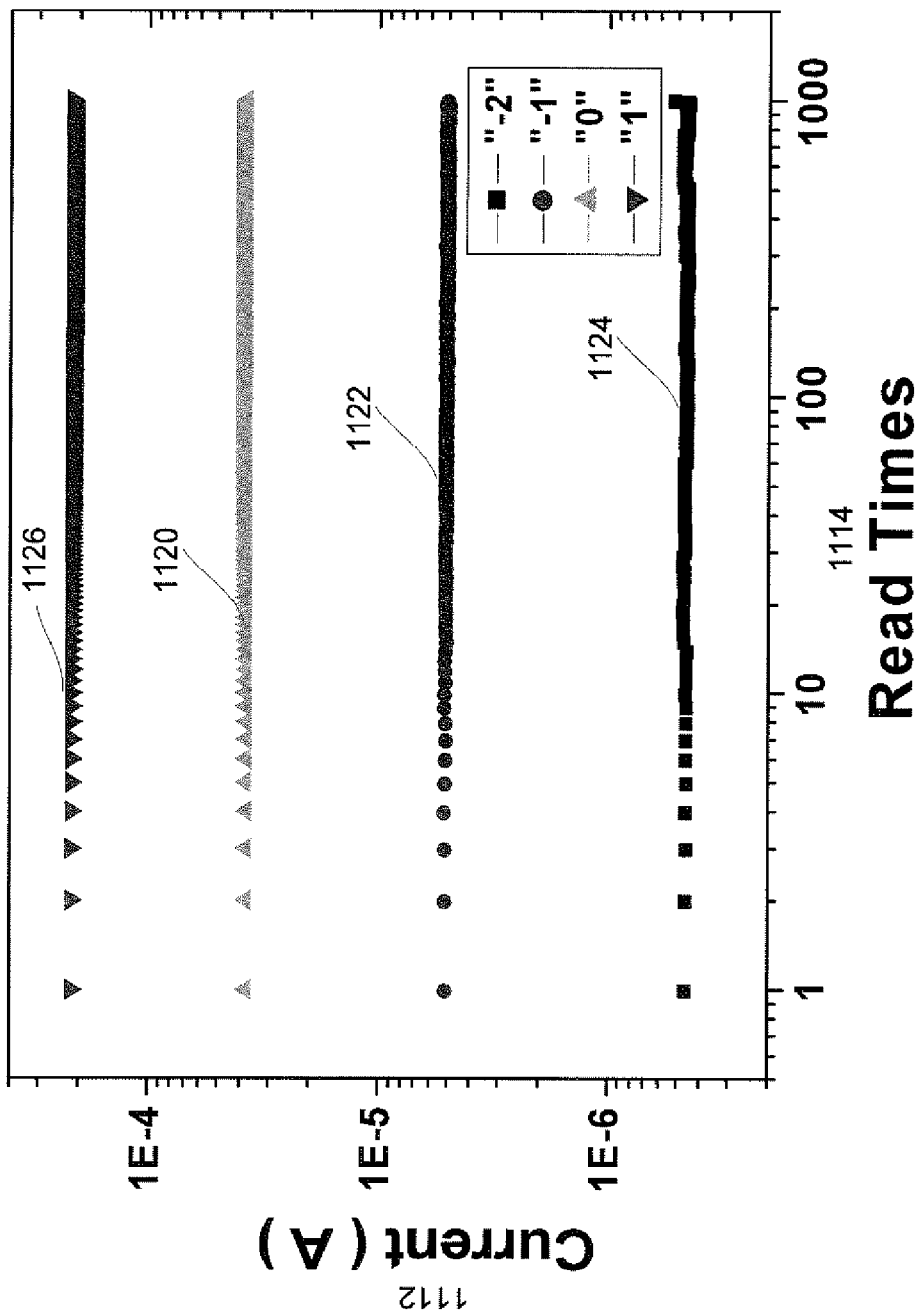
FIG. 9 is a graph illustrating an example of the multilevel-cell control of read currents for the first embodiment in the memory structures with the tungsten oxide region serving as an active area in accordance with the present invention.

FIG. 9 is a graph 1100 illustrating an example of the multilevel-cell control of read currents for the first embodiment in the memory structures 800 with the tungsten oxide region 520 serving as an active area. The graph 1110 is depicted with the x-axis 1112 representing the amount of electrical current, and the y-axis representing the read time 1114. The active area, i.e. the tungsten oxide region 520, is operable in 4 states (2 bits/cell) for each memory layer as defined by the level of a read current. The four different states in the multilevel-cell control are determined by the amount of read current. A first data line 1120 represents a first state (the "0" state), a second data line 1122 represents a second state (the "−1" state), a third data line 1124 represents a third state (the "−2" state), and the fourth data line 1126 represents a fourth state (the "1" state). The highest read current state requires a high current to conduct a read operation. A reduction in the active area, for example, to be 1/10 size can decrease the current density loading of a diode to around lower than 103 A/cm2. In one embodiment, the read currents for each of the four states are: 4 nA, 40 nA, 0.4 µA, and 2 µA. The present invention can be extended to further divide the read current windows for a memory cell that has multiple bits, such as 4 bits in a memory cell with 16 representative states.

The tungsten oxide memory material can be replaced using other two-element compounds, such as $Ni_xO_y$; $Ti_xO_y$; $Al_xO_y$; $W_xO_y$; $Zn_xO_y$; $ZrxO_y$; $Cu_xO_y$; etc, where x:y=0.5:0.5, or other compositions with x: 0~1; y: 0~1. An exemplary formation method uses a PVD sputtering or magnetron-sputtering method with reactive gases of Ar, $N_2$, $O_2$, and/or He, etc. at the pressure of 1 mTorr 100 mTorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually performed at room temperature. A collimator with an aspect ratio of 1~5 can be used to improve the fill-in performance. To improve the fill-in performance, the DC bias of several tens of volts to several hundreds of volts is also used. If desired, the combination of DC bias and the collimator can be used.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an annealing time of less than 2 hours.

An alternative formation method uses a PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mTorr~100 mTorr, using a target of metal oxide, such as Ni, Ti, Al, W, Zn, Zr, or Cu etc. The deposition is usually performed at room temperature. A collimater with an aspect ratio of 1~5 can be used to improve the fill-in performance. To improve the fill-in performance, a DC bias of several tens of volts to several hundreds of volts is also used. If desired, the combination of DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an annealing time of less than 2 hours.

Yet another formation method uses oxidation by a high temperature oxidation system, such as a furnace or a rapid thermal pulse ("RTP") system. The temperature ranges from 200° C. to 700° C. with pure $O_2$ or $N_2/O_2$ mixed gas at a pressure of several mTorr to 1 atm. The time can range several minutes to hours. Another oxidation method is plasma oxidation. An RF or a DC source plasma with pure $O_2$ or $Ar/O_2$ mixed gas or $Ar/N_2/O_2$ mixed gas at a pressure of 1 mTorr to 100 mTorr is used to oxidize the surface of metal, such as Ni, Ti, Al, W, Zn, Zr, or Cu etc. The oxidation time ranges several seconds to several minutes. The oxidation temperature ranges from room temperature to 300° C., depending on the degree of plasma oxidation.

We claim:
1. A method for manufacturing a memory device, comprising:
   forming a first electrode comprising a metal material, the first electrode extending to a top surface of a dielectric layer;

etching the first electrode to remove a portion of the first electrode, thereby forming a recess extending below the top surface of the dielectric layer;

forming a dielectric sidewall spacer within the recess and on the first electrode, the dielectric sidewall spacer having an inner surface defining an opening within the recess, the opening overlying an exposed portion of the first electrode;

oxidizing the exposed portion of the first electrode to form a metal oxide memory element comprising an oxide of said metal material embedded within the first electrode; and forming a second electrode in contact with the metal oxide memory element.

2. The method of claim 1, wherein forming the second electrode comprises forming a bit line which includes the second electrode.

3. The method of claim 1, wherein:

forming the first electrode comprises:
 forming a via within the dielectric layer;
 forming a barrier material on sidewalls of the via;
 forming the metal material on the barrier material and filling the via; and etching the first electrode comprises:
 etching the metal material using a first etch chemistry; and
 etching the barrier material using a second etch chemistry.

4. The method of claim 3, wherein:

the first etch chemistry comprises a $SF_6$ dry etch; and the second etch chemistry comprises an etch using chlorine, trichloroborane or argon.

5. The method of claim 1, wherein said oxidizing comprises plasma oxidation.

6. The method of claim 1, further comprising:

forming a first diode, the first diode underlying and electrically coupled to the first electrode;

forming a second diode overlying and electrically coupled to the second electrode; and forming a second metal oxide memory element, comprising:
 forming a third electrode overlying and electrically coupled to the second diode, and extending to a top surface of a second dielectric layer, the third electrode comprising a second metal material;
 etching the third electrode to remove a portion of the third electrode, thereby forming a second recess extending below the top surface of the second dielectric layer;
 forming a second dielectric sidewall spacer within the second recess and on the third electrode, the second dielectric sidewall spacer having an inner surface defining a second opening within the second recess, the second opening overlying an exposed portion of the third electrode;
 oxidizing the exposed portion of the third electrode to form the second metal oxide memory element comprising an oxide of said second metal material and embedded within the third electrode; and
 forming a fourth electrode in contact with the second metal oxide memory element.

7. The method of claim 6, further comprising forming a first bit line underlying and electrically coupled to the first diode, and wherein:

forming the second electrode comprises forming a second bit line which includes the second electrode; and forming the fourth electrode comprising forming a third bit line which includes the fourth electrode.

8. The method of claim 7, wherein:

the first bit line and the second bit line are arranged in non-parallel directions, and said metal oxide memory element lies in a cross-point between the first and second bit lines; and the second bit line and the third bit line are arranged in non-parallel directions, and the second metal oxide memory element lies in a cross-point between the second and third bit lines.

9. A method for manufacturing a memory device, comprising:

forming a first electrode comprising a metal extending through a dielectric layer to an underlying bit line;

forming a metal oxide memory element electrically coupled to the first electrode by oxidizing a portion of the metal of the first electrode; and forming a second electrode electrically coupled to the metal oxide memory element and in direct and physical contact with the metal oxide memory element, wherein the metal oxide memory element has a width transverse to an inter-electrode current path between the first and second electrodes through the metal oxide memory element which is less than a width of a top electrode surface of the first electrode.

10. The method of claim 9, further comprising:

forming a third electrode extending through a dielectric layer to the second electrode;

forming a second metal oxide memory element electrically coupled to the third electrode; and forming a fourth electrode electrically coupled to the second metal oxide memory element and in direct and physical contact with the second metal oxide memory element, wherein the second metal oxide memory element has a width transverse to an inter-electrode current path between the third and fourth electrodes through the second metal oxide memory element which is less than a width of the third electrode.

11. A method for manufacturing a memory device, comprising:

forming a diode;

forming a metal element overlying and electrically coupled to the diode;

forming a memory element comprising a metal oxide active layer by oxidizing a portion of the metal element; and forming an electrode overlying and electrically coupled to the metal oxide memory element and in direct and physical contact with the metal oxide memory element, wherein the metal oxide memory element has a width transverse to an inter-electrode current path between the diode and the electrode and through the metal oxide memory element which is less than a width of the diode.

12. The method of claim 11, further comprising:

forming a second diode overlying and electrically coupled to said electrode;

forming a second memory element comprising a metal oxide active layer, overlying and electrically coupled to the second diode; and forming a second electrode overlying and electrically coupled to the second metal oxide memory element and in direct and physical contact with the second metal oxide memory element, wherein the second metal oxide memory element has a width transverse to an inter-electrode current path between the second diode and the second electrode and through the second metal oxide memory element which is less than a width of the second diode.

* * * * *